(12) United States Patent
Liao

(10) Patent No.: US 10,825,704 B1
(45) Date of Patent: Nov. 3, 2020

(54) CHIP TRANSFERRING MACHINE

(71) Applicant: ASTI GLOBAL INC., TAIWAN, Taichung (TW)

(72) Inventor: Chien-Shou Liao, New Taipei (TW)

(73) Assignee: ASTI GLOBAL INC., TAIWAN, Taichung (TW)

( * ) Notice: Subject to any disclaimer, the term of this patent is extended or adjusted under 35 U.S.C. 154(b) by 0 days.

(21) Appl. No.: 16/599,312

(22) Filed: Oct. 11, 2019

(30) Foreign Application Priority Data

Apr. 19, 2019 (TW) .............................. 108113905 A

(51) Int. Cl.
*H01L 21/67* (2006.01)
*H01L 21/677* (2006.01)
*H01L 21/683* (2006.01)
*B65G 47/91* (2006.01)
*H01L 21/673* (2006.01)

(52) U.S. Cl.
CPC ........ *H01L 21/67736* (2013.01); *B65G 47/91* (2013.01); *H01L 21/67333* (2013.01); *H01L 21/67706* (2013.01); *H01L 21/6836* (2013.01); *H01L 21/6838* (2013.01)

(58) Field of Classification Search
None
See application file for complete search history.

(56) References Cited

U.S. PATENT DOCUMENTS

| 6,204,092 | B1 * | 3/2001 | Freund | H01L 21/67132 438/113 |
| 6,749,890 | B2 * | 6/2004 | Onodera | H01G 13/006 427/79 |
| 2004/0192012 | A1 * | 9/2004 | Takezoe | H01L 21/6835 438/460 |

* cited by examiner

*Primary Examiner* — Ronald P Jarrett
(74) *Attorney, Agent, or Firm* — Li & Cai Intellectual Property (USA) Office

(57) ABSTRACT

A chip transferring machine includes a chip carrier, a chip transferring module, and a chip carrier substrate. The chip carrier carries a plurality of chips. The chip transferring module includes at least one conveyor belt having an adhesive surface. The chip carrier substrate carries the plurality of chips. The chip carrier, the chip transferring module, and the chip carrier substrate are disposed on a same production line, and the chip carrier and the chip carrier substrate are disposed under or above the adhesive surface of the conveyor belt.

8 Claims, 11 Drawing Sheets

CHIP TRANSFERRING MACHINE

CROSS-REFERENCE TO RELATED PATENT APPLICATION

This application claims the benefit of priority to Taiwan Patent Application No. 108113905, filed on Apr. 19, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a transferring machine, and more particularly to a chip transferring machine.

BACKGROUND OF THE DISCLOSURE

Generally, when the prepared chip array is transferred to a substrate or panel of different size, the time required for the migration is long due to the complicated process involved.

Therefore, improving the efficiency and speed of chip transferring through structural design or procedural improvement has become one of the important issues to be solved in the technical field of the present disclosure.

SUMMARY OF THE DISCLOSURE

In response to the above-referenced technical inadequacies, the present disclosure provides a chip transferring machine.

In one aspect, the present disclosure provides a chip transferring machine including: a chip carrier, a chip transferring module, and a chip carrier substrate. The chip carrier carries a plurality of chips. The chip transferring module includes at least one conveyor belt having an adhesive surface. The chip carrier substrate carries the plurality of chips. The chip carrier, the chip transferring module, and the chip carrier substrate are disposed on a same production line, and the chip carrier and the chip carrier substrate are disposed under or above the adhesive surface of the conveyor belt.

In one aspect, the present disclosure provides a chip transfer machine including a chip carrier, a chip transferring module, and a chip carrier substrate. The chip transferring module includes at least one conveyor belt having an adhesive surface, and the chip carrier and the chip carrier substrate is disposed under or above the adhesive surface of the conveyor belt.

Therefore, one of the beneficial effects of the present disclosure is that by the technical features of "the chip transferring module including the at least one conveyor belt having the adhesive surface" and "the chip carrier, the chip transferring module, and the chip carrier substrate being disposed on the same production line, and the chip carrier and the chip carrier substrate being disposed under or above the adhesive surface of the conveyor belt," the efficiency and speed of chip transferring can be improved.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

FIG. 6 is a schematic diagram showing a second state in the chip transfer process of the chip transferring machine according to the first embodiment of the present disclosure; wherein FIG. 6 and FIG. 5 depict the same chip transfer process.

DETAILED DESCRIPTION OF THE EXEMPLARY EMBODIMENTS

Figure 1:
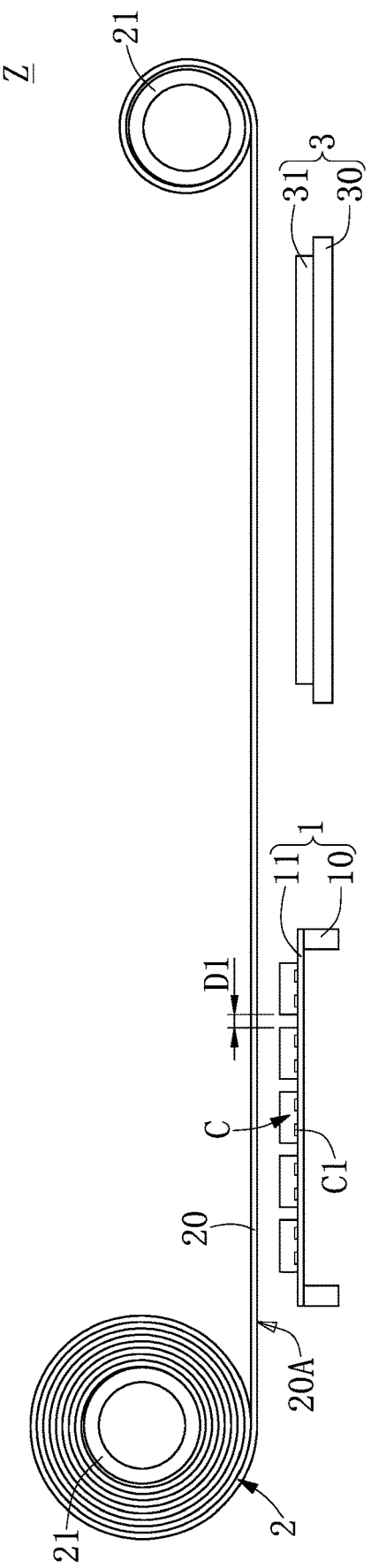
FIG. 1 is a structural schematic view of a chip transferring machine according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 9, a first embodiment of the present disclosure provides a chip transfer machine Z including a chip carrier 1, a chip transferring module 2, and a chip carrier substrate 3.

Firstly, as shown in FIG. 1, the chip carrier 1 may be disposed under at least one conveyor belt 20 of the chip transferring module 2 and correspond to an adhesive surface 20A of the conveyor belt 20. For example, the chip carrier 1 can carry a plurality of chips C, each of the chips C has at least one solder C1, and the solder C1 can be solder paste or other conductive materials. Further, the chip carrier 1 may include a carrier adjustment mechanism 10 and a carrier film 11 for carrying the chip C, and the carrier film 11 is disposed on the carrier adjustment mechanism 10. The carrier adjustment mechanism 10 can be an X-Y table, but the present disclosure is not limited thereto. The carrier film 11 can be a blue PVC film, but the present disclosure is not limited thereto. The carrier adjustment mechanism 10 can be fixed onto the carrier film 11 by suction or clamping, but the present disclosure is not limited thereto. The carrier film 11 can carry the plurality of chips C, and there is a spacing D1 between the adjacent two chips C.

Next, as shown in FIG. 1, the chip transferring module 2 includes the conveyor belt 20 having the adhesive surface 20A, and the conveyor belt 20 may be a light-transmitting single-sided tape, but present disclosure is not limited thereto. Further, the chip transferring module 2 may further include at least two rollers 21, one end of the conveyor belt 20 may be connected to one of the rollers 21, and the other end of the conveyor belt 20 may be connected to the other roller 21. Therefore, in a process of transferring and retracting the conveyor belt 20, the conveyor belt 20 can be transferred from one of the rollers 21 to the other roller 21, and is transferred in only one direction, but the present disclosure is not limited thereto.

Next, as shown in FIG. 1, the chip carrier substrate 3 can be used to carry a plurality of chips C, and the chip carrier substrate 3 can be disposed under the conveyor belt 20 of the chip transferring module 2 and corresponds to the adverse surface 20A of the conveyor belt 20. Further, the chip carrier substrate 3 may include a carrier substrate adjustment mechanism 30 and a circuit substrate 31 for carrying the chip C, and the circuit substrate 31 is disposed on the carrier substrate adjustment mechanism 30. The carrier substrate adjustment mechanism 30 can be an X-Y table, but the present disclosure is not limited thereto.

Accordingly, as shown in FIG. 1, the chip carrier 1, the chip transferring module 2, and the chip carrier substrate 3 may be disposed on a same production line, and the chip carrier 1 and the chip carrier substrate 3 are disposed under the adhesive surface 20A of the conveyor belt 20. Therefore, the chip C on the chip carrier 1 can be transferred to the chip carrier substrate 3 by the conveyor belt 20.

Figure 2:
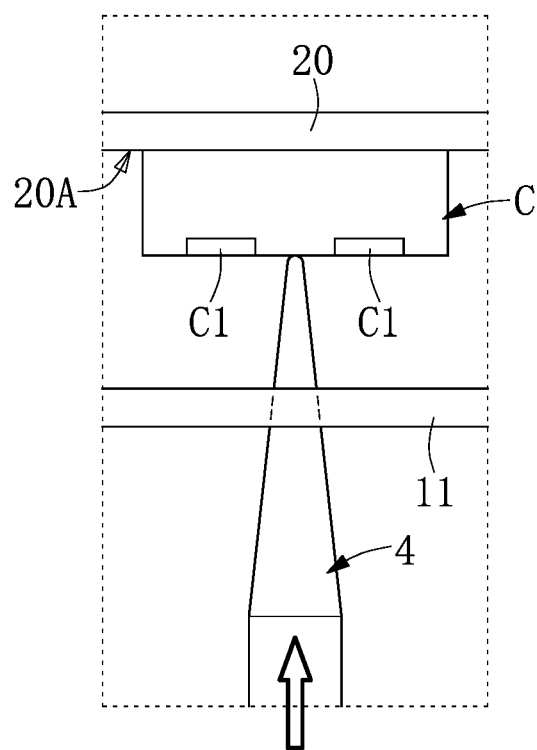
FIG. 2 is a schematic diagram of an operation of a thimble module of the chip transfer machine according to the first embodiment of the present disclosure.
Figure 3:
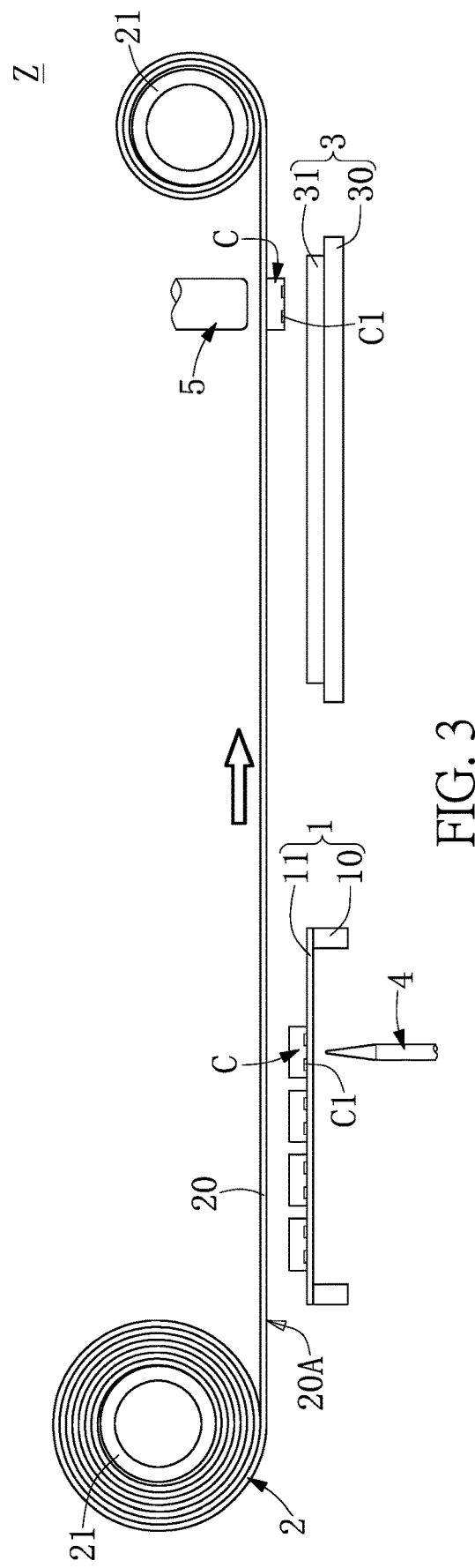
FIG. 3 is a schematic diagram of a state in which the chip transferring machine transfers a chip to a chip carrier substrate according to the first embodiment of the present disclosure.
Figure 4:
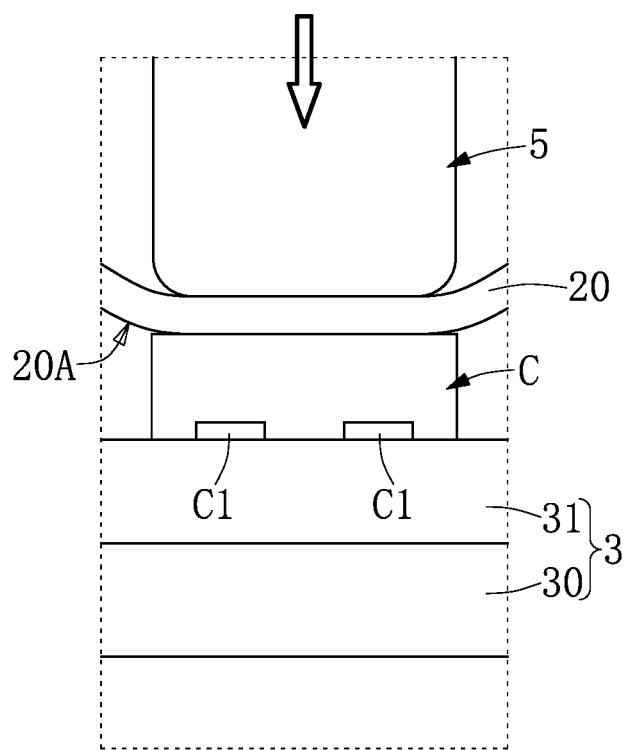
FIG. 4 is a schematic diagram of an operation of a push module of the chip transfer machine according to the first embodiment of the present disclosure.
Figure 5:
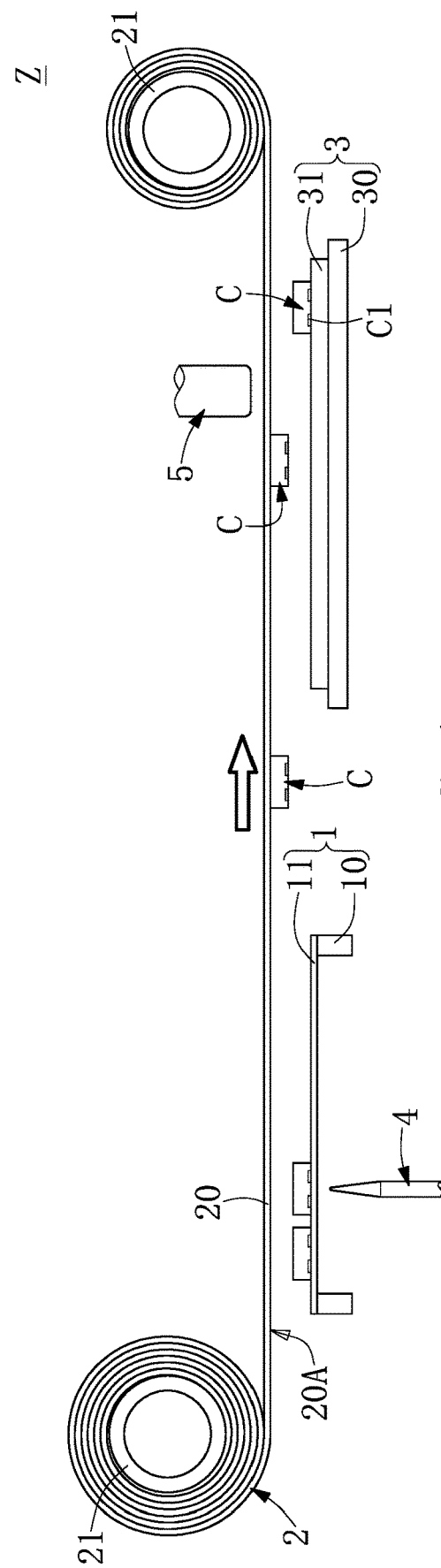
FIG. 5 is a schematic diagram showing a first state in a chip transfer process of the chip transferring machine according to the first embodiment of the present disclosure.

Further, as shown in FIG. 1 to FIG. 3, the chip transfer machine Z provided by the present disclosure may further include: a thimble module 4 disposed under the chip carrier 1, and the at least one chip C disposed on the chip carrier 1 is transferred by adhesion of the thimble module 4 to the adhesive surface 20A of the conveyor belt 20. For example, the thimble module 4 can be disposed under the carrier film 11 of the chip carrier 1. The material of the thimble module 4 can be a metal or plastic thimble, and a portion of the thimble module 4 that abuts against the chip C can be a sharp or blunt, but the present disclosure is not limited thereto. Therefore, as shown in FIG. 2, the thimble module 4 can pass through the carrier film 11, and the chip C corresponding to the thimble module 4 can be abutted against the adhesive surface 20A of the conveyor belt 20, so that the chip C is attached to the adhesive surface 20A by detaching from the carrier film 11.

Further, as shown in FIG. 1 to FIG. 3, the above-mentioned process is repeated by the thimble module 4, and the remaining chips C on the carrier film 11 are sequentially detached from the carrier film 11 and attached to the adhesive surface 20A. Further, the chip transfer machine Z can also horizontally offset the thimble module 4 relative to the carrier film 11 by controlling the thimble module 4, or the carrier film 11 can be horizontally offset relative to the thimble module 4, so that the chip C is attached to the adhesive surface 20A by the thimble module 4 sequentially or randomly abutting the chip C on the carrier film 11. However, the above-mentioned examples illustrate only one of the embodiments, and the present disclosure is not limited thereto.

Further, as shown in FIG. 3 to FIG. 6, the chip transfer machine Z provided by the present disclosure may further include: a push module 5 disposed on at least one conveyor belt 20 and adhered to at least one chip C on the adhesive surface 20A by the push module 5 abutting downwardly. For example, as shown in FIG. 3 to FIG. 6, the push module 5 may be disposed above the conveyor belt 20 and face a non-adhesive surface 20B. The push module 5 may be a pillar of a metal or plastic material, but the present disclosure is not limited thereto. Therefore, when the chip C is transferred above the circuit substrate 31 through the adhesive surface 20A of the conveyor belt 20, the chip C adhered to the adhesive surface 20A is transferred and disposed on the chip carrier substrate 31 by the push module 5 abutting downwardly. In addition, by repeating the above process through the push module 5, the remaining chips C on the conveyor belt 20 can be transferred from the adhesive surface 20A sequentially and then disposed on the circuit substrate 31. However, the above-mentioned examples illustrate only one of the embodiments, and the present disclosure is not limited thereto.

Finally, the circuit substrate 31 provided with the chips C is subjected to a heating process so that the chips C are fixed by the solder C1 and electrically connected to the circuit substrate 31. However, the above-mentioned examples illustrate only one of the embodiments, and the present disclosure is not limited thereto.

Figure 6:
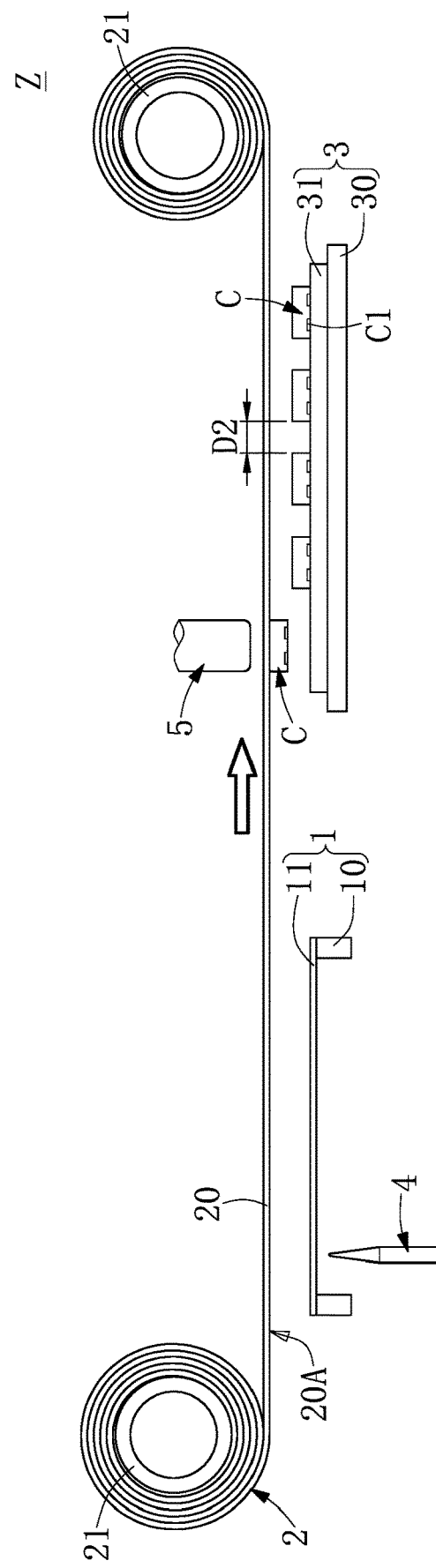
Figure 7:
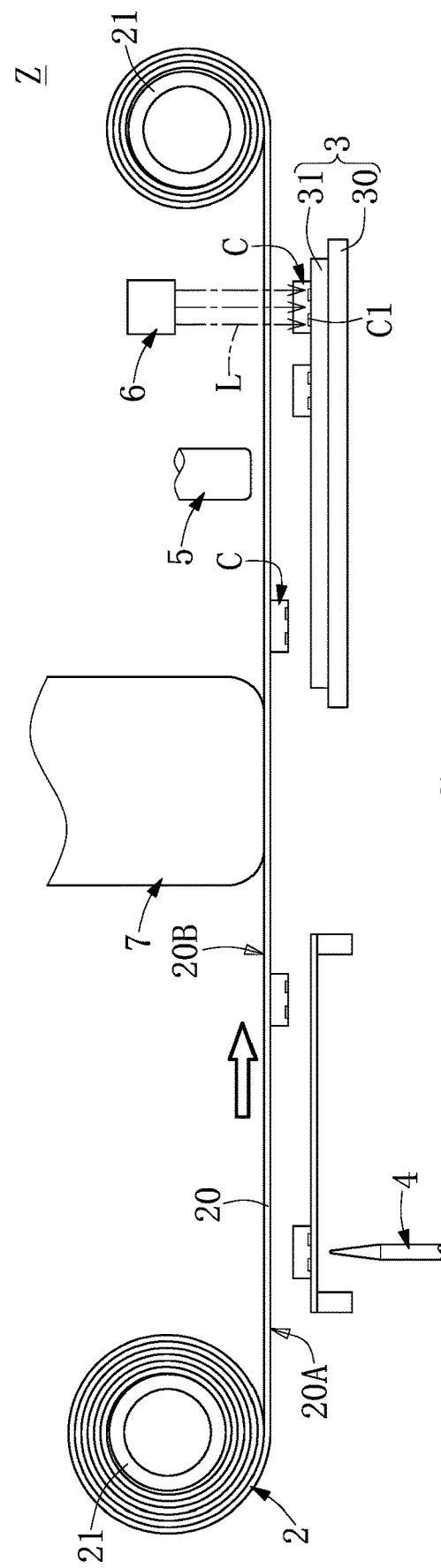
FIG. 7 is a structural schematic view of the chip transferring machine according to the first embodiment of the present disclosure.

Further, as shown in FIG. 6 and FIG. 7, the chip transfer machine Z provided by the present disclosure may further include: a laser generating module 6 and a vacuum suction module 7. The laser generating module 6 and the vacuum suction module 7 are disposed above at least one conveyor belt 20, and a laser beam L generated by the laser generating module 6 passes through at least one conveyor belt 20 to project onto the solder C1 disposed on at least one chip C. The vacuum suction module 7 suctions at least one non-adhesive surface 20B of the conveyor belt 20 to adjust the flatness of at least one conveyor belt 20. For example, as shown in FIG. 6 and FIG. 7, the chip transfer machine Z of the present disclosure can also be provided with the laser generating module 6 and the vacuum suction module 7 above the conveyor belt 20. Therefore, after the chip C is transferred to the circuit substrate 31, the laser beam L can be projected toward the chip C through the laser generating module 6, and the laser beam L is projected through the conveyor belt 20 and projected on the solder C1 disposed on the chip C, so that the solder C1 is heated to be fixed and electrically connected to the circuit substrate 31. In addition, by suctioning the non-adhesive surface 20B of the conveyor belt 20 through the vacuum suction module 7, the flatness of the conveyor belt 20 can be maintained to avoid affecting the flatness of the conveyor belt 20 while the push module 5 is abutting downwardly against the conveyor belt 20 and the chip C, so that the chip C cannot easily attach to the adhesive surface 20A, and other manufacturing problems can be avoided.

Figure 8:
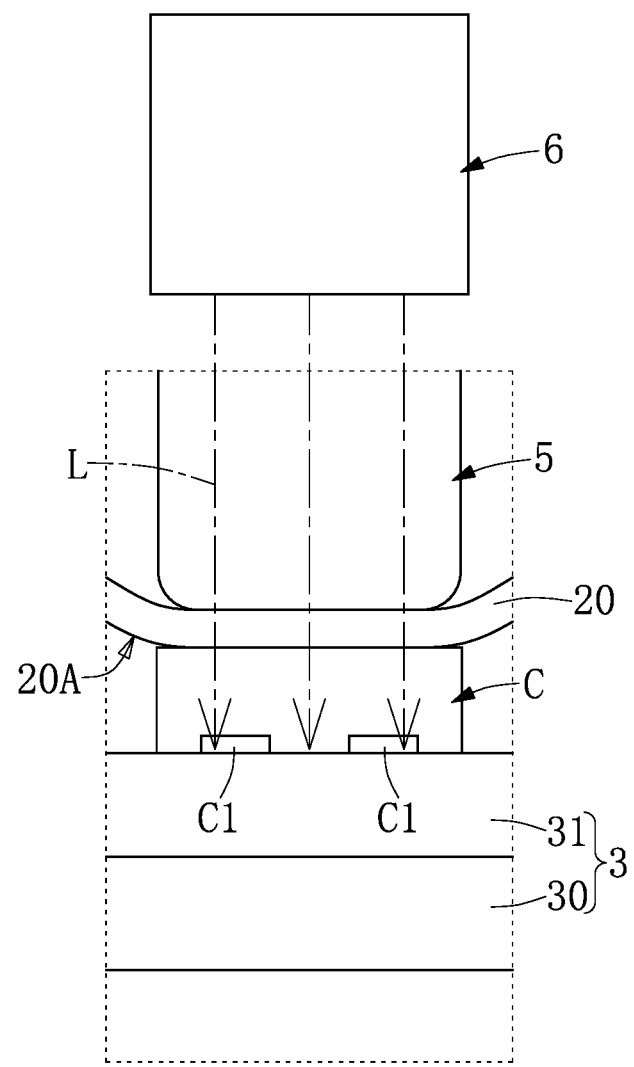
FIG. 8 is a schematic diagram of an operation of the push module and the laser generating module of the chip transfer machine according to the first embodiment of the present disclosure.

In addition, as shown in FIG. 6 to FIG. 8, the laser generating module 6 can also be operated together with the push module 5. Further, the laser generating module 6 and the push module 5 may be in the same axial direction, or a laser beam L projection path of the laser generating module 6 can correspond to the abutting surface of the push module 5. Therefore, when the push module 5 abuts the chip C and the chip C is transferred to the circuit substrate 31, the laser beam can be projected to the chip C through the laser generating module 6, so that the chip C can be fixed and electrically connected to the circuit substrate 31 through the solder C1.

Further, as shown in FIG. 1 and FIG. 6, the chip transfer machine Z provided by the present disclosure can also be horizontally offset from the circuit substrate 31 by controlling the push module 5, or the carrier substrate adjustment mechanism 30 drives the circuit substrate 31 to perform the horizontal offset relative to the push module 5, so that after the chip C is transferred to the circuit substrate 31, the spacing D2 between the two adjacent chips C may be greater than or less than the spacing D1, but the present disclosure is not limited thereto, and the spacing D2 may be equal to the spacing D1. Further, in the above-mentioned method, the circuit substrate 31 having damaged chips C can be repaired. For example, as shown in FIG. 1 to FIG. 9, after the circuit substrate 31 having the damaged chip C is placed in the carrier substrate adjustment mechanism 30, the damaged chip C on the conveyor belt 20 can be transferred to a patch position P on the circuit substrate 31 through the push module 5, thereby achieving the effect of chip patching. However, the above-mentioned examples illustrate only one of the embodiments, and the present disclosure is not limited thereto.

Furthermore, referring to FIG. 1 to FIG. 9, the present disclosure may further provide a chip transfer machine Z including a chip carrier 1, a chip transferring module 2 and a chip carrier substrate 3. The chip transferring module 2 includes at least one conveyor belt 20 having an adhesive surface 20A, both of which are disposed under or above the adhesive surface 20A of the conveyor belt 20.

However, the above-mentioned examples illustrate only one of the embodiments, and the present disclosure is not limited thereto.

Second Embodiment

Figure 9:
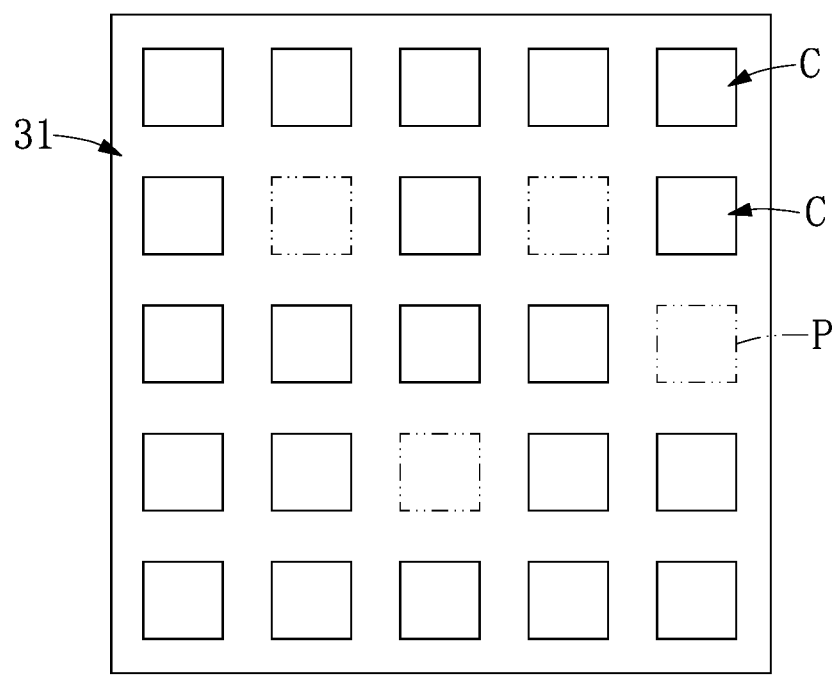
FIG. 9 is a top view of the circuit substrate of the chip transfer machine according to the first embodiment of the present disclosure.
Figure 10:
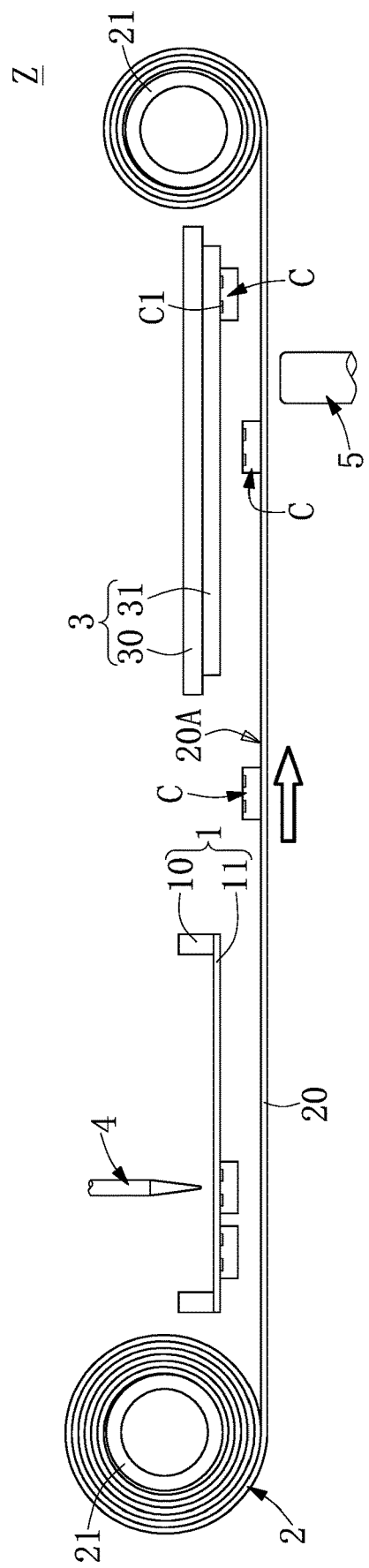
FIG. 10 is a structural schematic view of a chip transferring machine according to a second embodiment of the present disclosure.
Figure 11:
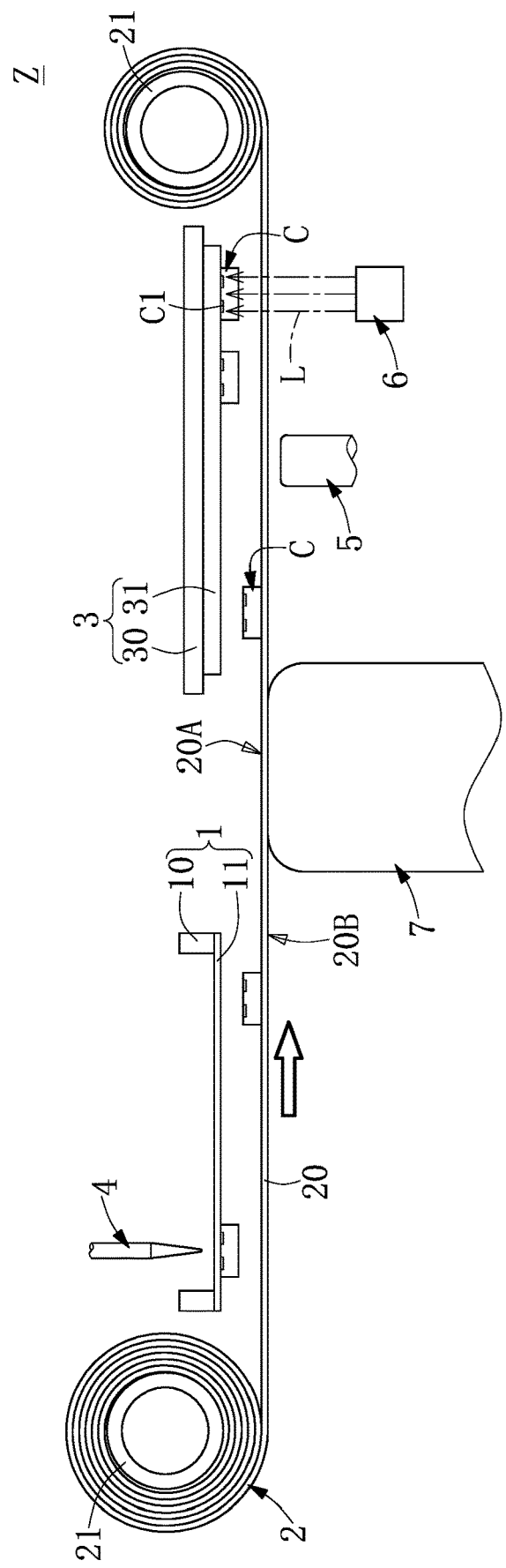
FIG. 11 is a structural schematic view of the chip transferring machine according to the second embodiment of the present disclosure.

Referring to FIG. 10 and FIG. 11 together with FIG. 1 to FIG. 9, a second embodiment of the present disclosure provides a chip transferring machine Z that is slightly similar to the chip transferring machine Z of the first embodiment. Therefore, similar steps will not be repeated herein. Further, according to FIG. 10, FIG. 11, FIG. 5 and FIG. 7, the difference between the second embodiment of the present disclosure and the first embodiment is that, both a chip carrier 1 and a chip carrier substrate 3 are disposed above an adhesive surface 20A of at least one conveyor belt 20 and face the adhesive surface 20A. Therefore, the chip C on the chip carrier 1 can be transported to the chip carrier substrate 3 by conveyance of the conveyor belt 20.

Further, as shown in FIG. 10, the chip transfer machine Z according to the second embodiment of the present disclosure may further include: a thimble module 4 disposed above the chip carrier 1, and at least one chip C disposed on the chip carrier 1 is transferred and adhered to the adhesive surface 20A of the at least one conveyor belt 20 by the thimble module 4 abutting downwardly. For example, as shown in FIG. 10, the thimble module 4 can be disposed above the carrier film 11 of the chip carrier 1. Therefore, the thimble module 4 passes downward through the carrier film 11, and the chip C corresponding to the thimble module 4 can be abutted against the adhesive surface 20A of the conveyor belt 20, so that the chip C is detached from the carrier film 11 and attached to the adhesive surface 20A. However, the present disclosure is not limited thereto. In addition, by repeating the above method, the remaining chips C on the carrier film 11 are detached from the carrier film 11 sequentially and attached to the adhesive surface 20A, and a more detailed description thereof can be referred to in the first embodiment so that details are not described herein again.

Further, as shown in FIG. 10, the chip transfer machine Z provided by the second embodiment may further include: a push module 5 disposed under the conveyor belt 20 and adhered to at least one of the chips C on the adhesive surface 20A by the push module 5 abutting upwardly. For example, as shown in FIG. 10, the push module 5 may be disposed under the conveyor belt 20 and face a non-adhesive surface 20B. Therefore, when the chip C is transferred under the circuit substrate 31 through the adhesive surface 20A of the conveyor belt 20, the chip C adhered to the adhesive surface 20A is transferred and disposed on the chip carrier substrate 31 by the push module 5 abutting upwardly. In addition, by repeating the above method through the push module 5, the remaining chips C on the conveyor belt 20 can be sequentially transferred from the adhesive surface 20A, and then disposed on the circuit substrate 31. However, the above-mentioned examples illustrate only one of the embodiments, and the present disclosure is not limited thereto.

Finally, the circuit substrate 31 provided with the chips C is subjected to a heating process so that the chips C are fixed by the solder C1 and electrically connected to the circuit substrate 31. However, the above-mentioned examples illustrate only one of the embodiments, and the present disclosure is not limited thereto.

Further, as shown in FIG. 11, the chip transfer machine Z provided by the present embodiment may further include: a laser generating module 6 and a vacuum suction module 7.

The laser generating module 6 and the vacuum suction module 7 are disposed under at least one conveyor belt 20, and a laser beam L generated by the laser generating module 6 passes through the at least one conveyor belt 20 to project on the solder C1 disposed on the at least one chip C. The vacuum suction module 7 suctions at least one non-adhesive surface 20B of the conveyor belt 20 to adjust the flatness of at least one conveyor belt 20. For example, as shown in FIG. 11, the chip transfer machine Z of the present disclosure can also be provided with the laser generating module 6 and the vacuum suction module 7 under the conveyor belt 20. Therefore, after the chip C is transferred to the circuit substrate 31, the laser beam L can be projected toward the chip C through the laser generating module 6, and the laser beam L is projected through the conveyor belt 20 and projected onto the solder C1 disposed on the chip C, so that the solder C1 is heated to be fixed and electrically connected to the circuit substrate 31. In addition, by suctioning the non-adhesive surface 20B of the conveyor belt 20 through the vacuum suction module 7, the flatness of the conveyor belt 20 can be maintained to avoid affecting the flatness of the conveyor belt 20 while the push module 5 is abutting upwardly against the conveyor belt 20 and the chip C, so that the chip C cannot easily attach to the adhesive surface 20A, and other manufacturing problems can be avoided.

In addition, as shown in FIG. 8 to FIG. 10, the laser generating module 6 can also be operated together with the push module 5. Therefore, when the push module 5 is abuts the chip C and the chip C is transferred to the circuit substrate 31, the laser beam can be projected to the chip C through the laser generating module 6, so that the chip C can be fixed and electrically connected to the circuit substrate 31 through the solder C1. Details on a particular implementation of this embodiment can be referred to in the first embodiment, and will not be described herein again.

However, the above-mentioned examples illustrate only one of the embodiments, and the present disclosure is not limited thereto.

In conclusion, one of the beneficial effects of the present disclosure is that by the technical features of "the chip transferring module 2 including the at least one conveyor belt 20 having the adhesive surface 20A" and "the chip carrier 1, the chip transferring module 2, and the chip carrier substrate 3 being disposed on the same production line, and the chip carrier 1 and the chip carrier substrate 3 being disposed under or above the adhesive surface 20A of the conveyor belt 20," the transferring efficiency and speed of chip C can be improved.

Furthermore, the chip transfer machine Z provided by the present disclosure can not only improve the efficiency and speed of transferring the chips C, but also adjust the spacing D2 of the chip C on the circuit substrate 31, thereby customizing the circuit substrate 31. Moreover, the chip transfer machine Z of the present disclosure can also repair the circuit substrate 31 having the damaged chip C by the above-described technical solution, and fix the new chip C onto the patch position P.

Further, the chip transferring method and chip transferring apparatus provided by the present disclosure has the above-mentioned technical features so as to improve the efficiency and speed of the transferring of the chips 2 to the adhesive layer 4 of the substrate 5, and shorten the time taken for performing the same.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A chip transferring machine, comprising:
    a chip carrier carrying a plurality of chips;
    a chip transferring module including at least one conveyor belt having an adhesive surface;
    a chip carrier substrate carrying the plurality of chips; and
    a laser generating module and a vacuum suction module, wherein the laser generating module and the vacuum suction module are disposed above or under the conveyor belt, and a laser beam generated by the laser generating module passes through the conveyor belt to project onto a solder disposed on at least one of the chips, and the vacuum suction module suctions a non-adhesive surface of the conveyor belt to adjust the flatness of the conveyor belt;
    wherein the chip carrier, the chip transferring module, and the chip carrier substrate are disposed on a same production line, and the chip carrier and the chip carrier substrate are both disposed under or above the adhesive surface of the conveyor belt.

2. The chip transferring machine according to claim 1, further comprising a thimble module disposed under the chip carrier, wherein at least one of the chips disposed on the chip carrier is transferred and disposed on the adhesive surface of the conveyor belt by the thimble module abutting upwardly.

3. The chip transferring machine according to claim 2, further comprising a push module disposed above the conveyor belt, wherein the at least one of the chips adhered to the adhesive surface is transferred and disposed on the chip carrier substrate by the push module abutting downwardly.

4. The chip transferring machine according to claim 1, further comprising a thimble module disposed above the chip carrier, wherein at least one of the chips disposed on the chip carrier is transferred and disposed on the adhesive surface of the conveyor belt by the thimble module abutting downwardly.

5. The chip transferring machine according to claim 4, further comprising a push module disposed under the conveyor belt, wherein the at least one of the chips adhered to the adhesive surface is transferred and disposed on the chip carrier substrate by the push module abutting upwardly.

6. The chip transferring machine according to claim 1, wherein the chip transferring module includes at least two rollers, and the conveyor belt is transported by one of the rollers to another roller, and the conveyor belt is a light transmissive single-sided tape.

7. The chip transferring machine according to claim 1, wherein the chip carrier includes a carrier adjustment mechanism and a carrier film for carrying the chip, and the carrier film is disposed on the carrier adjustment mechanism; wherein the chip carrier substrate includes a carrier substrate adjustment mechanism and a circuit substrate for carrying the chip, and the circuit substrate is disposed on the carrier substrate adjustment mechanism.

8. A chip transferring machine comprising a chip carrier, a chip transferring module, a chip carrier substrate, a laser generating module and a vacuum suction module, wherein the chip transferring module includes at least one conveyor belt having an adhesive surface, and the chip carrier and the chip carrier substrate are disposed under or above the adhesive surface of the conveyor belt, and wherein the laser generating module and the vacuum suction module are disposed above or under the conveyor belt, and a laser beam generated by the laser generating module passes through the conveyor belt to project onto a solder disposed on at least one chip, and the vacuum suction module suctions a non-adhesive surface of the conveyor belt to adjust the flatness of the conveyor belt.

\* \* \* \* \*